United States Patent
Tateno

(10) Patent No.: US 8,766,208 B2
(45) Date of Patent: Jul. 1, 2014

(54) SECONDARY-ELECTRON DETECTOR AND CHARGED PARTICLE BEAM APPARATUS

(75) Inventor: Hiroshi Tateno, Tokyo (JP)

(73) Assignee: Horiba, Ltd., Kyoto (JP)

( * ) Notice: Subject to any disclaimer, the term of this patent is extended or adjusted under 35 U.S.C. 154(b) by 122 days.

(21) Appl. No.: 13/336,946

(22) Filed: Dec. 23, 2011

(65) Prior Publication Data

US 2012/0161000 A1    Jun. 28, 2012

(30) Foreign Application Priority Data

Dec. 28, 2010   (JP) ................. 2010-291579

(51) Int. Cl.
*H01J 3/14* (2006.01)
*G01N 23/00* (2006.01)

(52) U.S. Cl.
USPC ........... 250/397; 250/311; 250/306; 250/307

(58) Field of Classification Search
USPC .................. 250/310, 397, 311, 305, 306, 307
See application file for complete search history.

(56) References Cited

U.S. PATENT DOCUMENTS

| | | | |
|---|---|---|---|
| 4,442,355 A * | 4/1984 | Tamura et al. | 250/310 |
| 4,803,357 A * | 2/1989 | Brust | 250/310 |
| 4,818,874 A * | 4/1989 | Ishikawa | 250/310 |
| 4,922,097 A * | 5/1990 | Todokoro et al. | 250/310 |
| 5,656,807 A * | 8/1997 | Packard | 250/214 VT |
| 6,630,667 B1 * | 10/2003 | Wang et al. | 850/8 |
| 6,958,474 B2 * | 10/2005 | Laprade et al. | 250/287 |
| 7,026,177 B2 * | 4/2006 | Laprade | 438/20 |
| 7,135,678 B2 * | 11/2006 | Wang et al. | 250/310 |
| 2008/0308742 A1 * | 12/2008 | Gerlach et al. | 250/397 |

* cited by examiner

*Primary Examiner* — Nikita Wells
*Assistant Examiner* — Johnnie L Smith
(74) *Attorney, Agent, or Firm* — Kubovcik & Kubovcik

(57) ABSTRACT

A scintillator 21 is disposed on an incidence side 23a of a photomultiplier 23. A scintillator cap 22 for introducing electrons into the scintillator 21 is disposed around the scintillator 21. The photomultiplier 23 is disposed in a sample chamber 17 with a vacuum seal formed around the photomultiplier 23. An insulating member 25 made of an opaque material is disposed between the scintillator cap 22 and the photomultiplier 23. The insulating member 25 provides insulation between the scintillator cap 22 and the photomultiplier 23. The lateral circumference of the photomultiplier 23 is covered to prevent light from entering the photomultiplier 23. A band filter 27 for blocking the illumination light of an optical microscope 30 is disposed between the scintillator 21 and the incidence side 23a of the photomultiplier 23 to make it possible to conduct simultaneous observations by using the electrons and the optical microscope.

10 Claims, 3 Drawing Sheets

SECONDARY-ELECTRON DETECTOR AND CHARGED PARTICLE BEAM APPARATUS

BACKGROUND OF THE INVENTION

The present invention relates generally to a secondary electron detector and a charged particle beam apparatus. More specifically, the present invention relates to a secondary electron detector having a scintillator, which absorbs electrons and emits light, and a photomultiplier, which amplifies the light emitted from the scintillator, and a charged particle beam apparatus having the secondary electron detector.

The charged particle beam apparatus, such as a scanning electron microscope (SEM), an electron probe micro-analyzer (EPMA), a focused ion beam apparatus (FIB), or an electron beam thin film transistor (TFT) array inspection apparatus, irradiates a sample with primary charged particles and allows a secondary electron detector to detect secondary electrons emitted from the surface of the sample. The scanning electron microscope, which is the above-described charged particle beam apparatus, uses an electron gun to produce a beam of electrons as a primary electron beam, allows an objective lens or other converging unit to converge the electron beam on the sample, causes a scanning unit to perform a two-dimensional scan for the purpose of irradiating the sample with the electron beam, allows the secondary electron detector to detect secondary electrons generated upon electron beam irradiation, and obtains a scanned image of the sample by supplying a detection signal to a display unit that is synchronized with the electron beam scan.

FIG. 3 illustrates a publicly known secondary electron detector as an example of the above-described secondary electron detector. FIG. 3 is a cross-sectional view. The secondary electron detector 40 illustrated in FIG. 3 includes a scintillator 41 that emits light upon receipt of secondary electrons from a sample, a light guide 42 that guides the light emitted from the scintillator 41, a scintillator cap 43 that is disposed around the scintillator 41 to receive the application of a high voltage (e.g., 10 kV) for the purpose of enabling the scintillator to attract the secondary electrons, a photomultiplier (PMT) 44 that amplifies the light generated by the scintillator, and a socket 45 that accepts the photomultiplier 44. Reference should be made to JP 2004-14251-A2 and JP 2009-043594-A2.

The secondary electron detector 40 is structured so that the light guide 42 is mounted on a mounting member 47. The mounting member is mounted in a sample chamber, which is a vacuum chamber. This assures that the scintillator 41 is placed in a vacuum while the socket 45 is placed outside the sample chamber and under atmospheric pressure. Hence, a vacuum seal is formed between the light guide 42 and the mounting member 47. The light guide 42 is formed, for instance, by glass. The vacuum seal is formed by filling an adhesive 46 into a gap between the mounting member 47 and the circumference of the light guide 42. In FIG. 3, the reference numerals 46a and 46b denote a fill of the adhesive 46, and the reference numeral 48 denotes a cable that applies a high voltage to the scintillator cap 43. It should be noted that the vacuum seal may be formed with an O-ring.

In the secondary electron detector 40 illustrated in FIG. 3, however, weak light from the scintillator 41 passes through the light guide 42 and enters the photomultiplier 44. Therefore, the light is attenuated depending on a material of the light guide 42 and by its reflection from both end faces of the light guide 42. Consequently, the light from the scintillator 41 cannot be efficiently guided to the photomultiplier 44.

Further, in recent years, a scanning electron microscope in which an optical microscope and an electron microscope are disposed in the same sample chamber to observe the same sample has been made available. When such a scanning electron microscope is used, illumination light of the optical microscope enters from the scintillator 41 side. This illumination light can be blocked when a wavelength filter for blocking light within the wavelength region of the illumination light is disposed on the incidence side of the scintillator 41. However, light incident, for instance, from a lateral side of the light guide 42 enters the photomultiplier 44 and is detected. Therefore, the above scanning electron microscope is at a disadvantage in that an optical microscope image and an electron microscope image cannot be simultaneously observed.

In addition, a high voltage of several thousand volts is applied to the scintillator cap 43 while a voltage of several hundred volts is applied to the photomultiplier 44 so that electrons emitted from a photocathode are transferred to a dynode electrode. The applied voltage generates a potential on the surface of the photomultiplier 44. If the light guide is removed for direct contact for increasing detection efficiency, an electric discharge occurs between the above two members due to a potential difference therebetween. The electric discharge gives rise to a noise source, making it impossible to obtain an excellent image.

The present invention has been made in view of the above circumstances and provides a secondary electron detector and a charged particle beam apparatus that have a simple configuration and are capable of acquiring an excellent image with high detection efficiency while preventing an electric discharge.

SUMMARY OF THE INVENTION

The secondary electron detector provided by the present invention includes a scintillator, which absorbs electrons and emits light, and a photomultiplier, which amplifies the light emitted from the scintillator. The scintillator is disposed on the incidence side end of the photomultiplier. The circumference of the scintillator is covered with an electrode member for accelerating electrons toward the scintillator. An insulating member is disposed between the electrode member and the photomultiplier and brought into contact with the electrode member and the photomultiplier to insulate the electrode member from the photomultiplier.

A vacuum seal may be formed between the photomultiplier and a device mount. The secondary electron detector is mounted on the circumferential surface of the device mount.

A pass filter for blocking light in a particular wavelength region to prevent the light from entering the photomultiplier may be disposed in a space that is formed by the thickness of the insulating member and positioned between the scintillator and the incidence side end of the photomultiplier.

It is preferred that the insulating member be made of an opaque material for blocking the entry of light and disposed to cover the circumference of the photomultiplier.

The charged particle beam apparatus provided by the present invention includes electron beam irradiation means, which irradiates the sample with an electron beam, and the secondary electron detector described above. Further, an optical microscope and a sample illuminating device are included so that observations can be simultaneously conducted by using the electron beam and the optical microscope. The secondary electron detector described above may be mounted on a main body of the apparatus while a vacuum seal is formed on a lateral side of the photomultiplier.

DETAILED DESCRIPTION OF THE INVENTION

Figure 1:
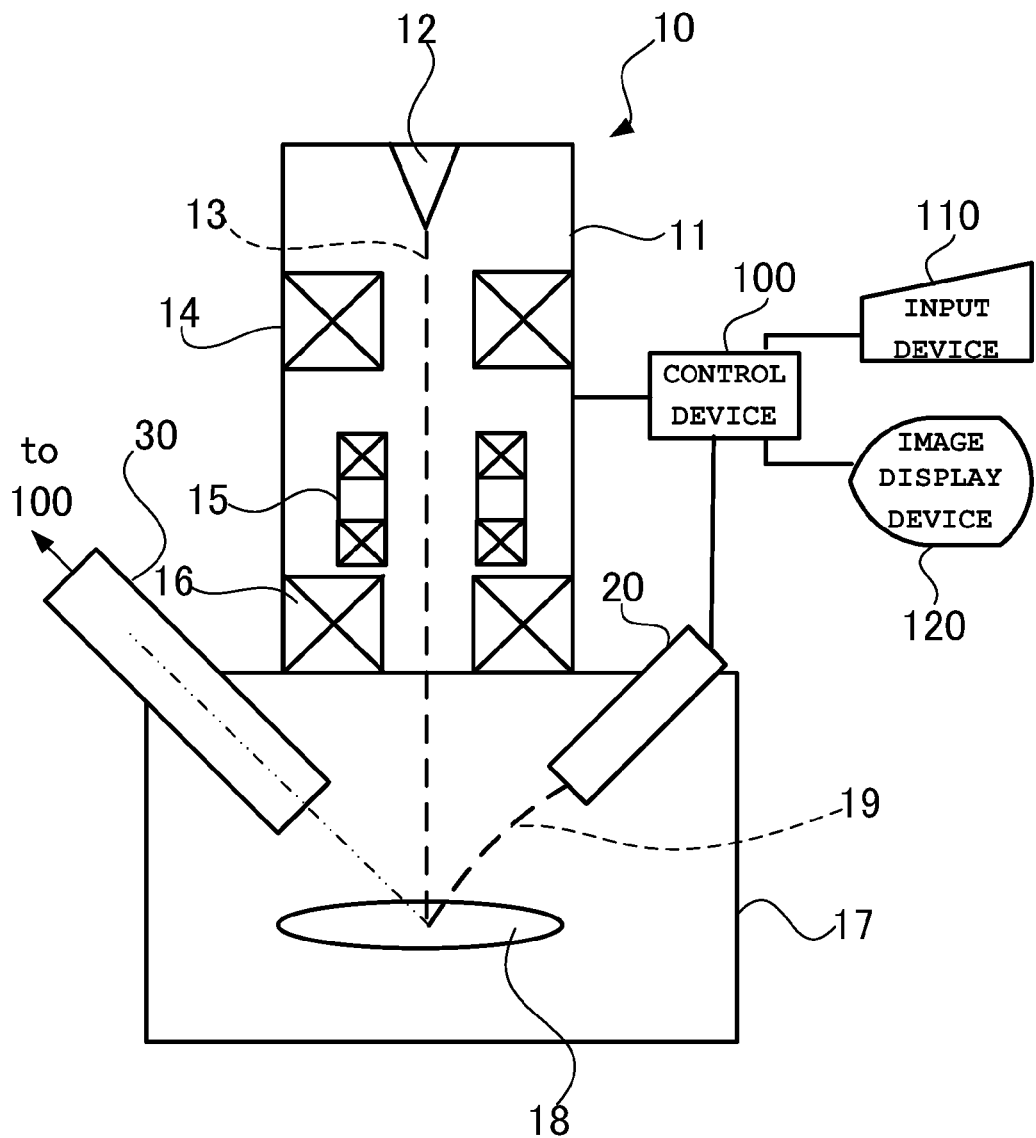
FIG. 1 is a schematic diagram illustrating a charged particle beam apparatus according to an embodiment of the present invention.

Embodiments of the present invention will now be described while a scanning electron microscope is used as an example. The present invention can be applied to a charged particle beam apparatus such as an electron probe microanalyzer (EPMA), a focused ion beam apparatus (FIB), or an electron beam thin film transistor (TFT) array inspection apparatus.

In the scanning electron microscope 10, an electron beam 13, that is, a charged beam generated from an electron beam source 12, which is a charged beam source in the upper area within a lens barrel 11, is converged by a condenser lens 14. Further, in the scanning electron microscope 10, thus-converged electron beam 13 is deflection-scanned by a deflection coil 15, converged and refocused by an objective lens 16, and used to perform a two-dimensional scan of a sample 18 in a sample chamber 17. Secondary electrons 19 are emitted from the sample 18 that has been scanned by the electron beam, and the secondary electrons 19 are detected by a secondary electron detector 20.

Further, a control device 100, an input device 110, and an image display device 120 are disposed in the scanning electron microscope 10. The control device 100 not only generates a scan signal for the deflection coil 15 and a control signal for the objective lens 16, but also synchronizes the scan signal with a signal from the secondary electron detector 20 to let the image display device 120 display a scanning electron microscope image (SEM image).

Moreover, an optical microscope 30 is disposed in the scanning electron microscope 10. The optical microscope 30 can provide illumination light having a predetermined wavelength, pick up an enlarged image of the sample 18 with an image pickup device, and permit the control device 100 to simultaneously display the enlarged image and the SEM image on the image display device 120. The sample 18 is placed on a sample stage (not illustrated) and can be moved to a desired position and tilted at an appropriate angle for observation.

Figure 2:
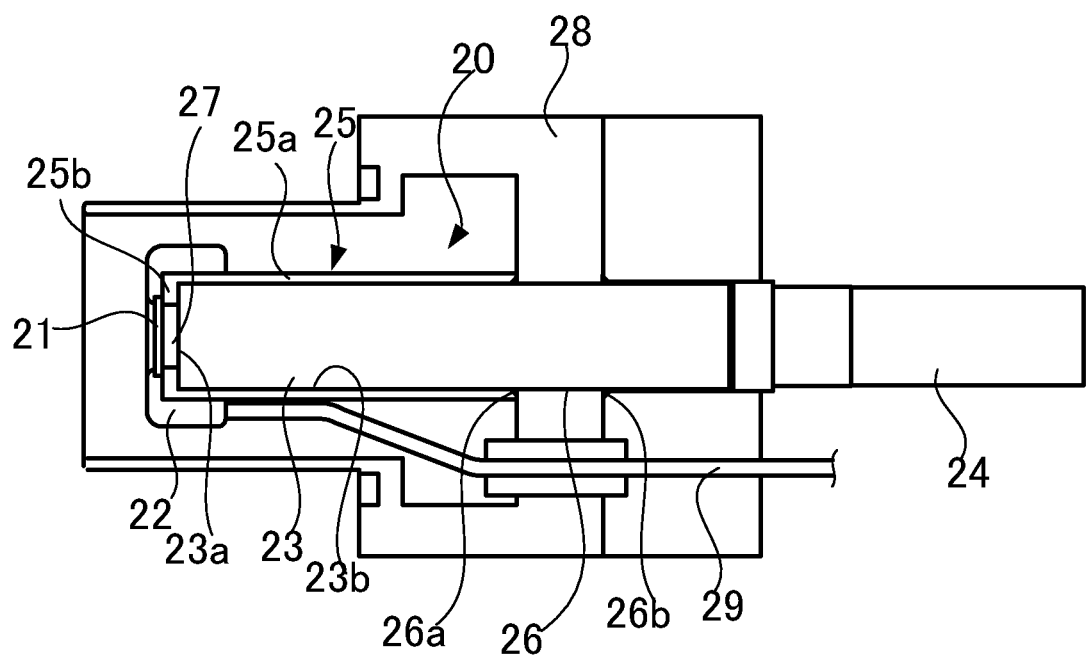
FIG. 2 is a cross-sectional view illustrating a secondary electron detector according to an embodiment of the present invention.
Figure 3:
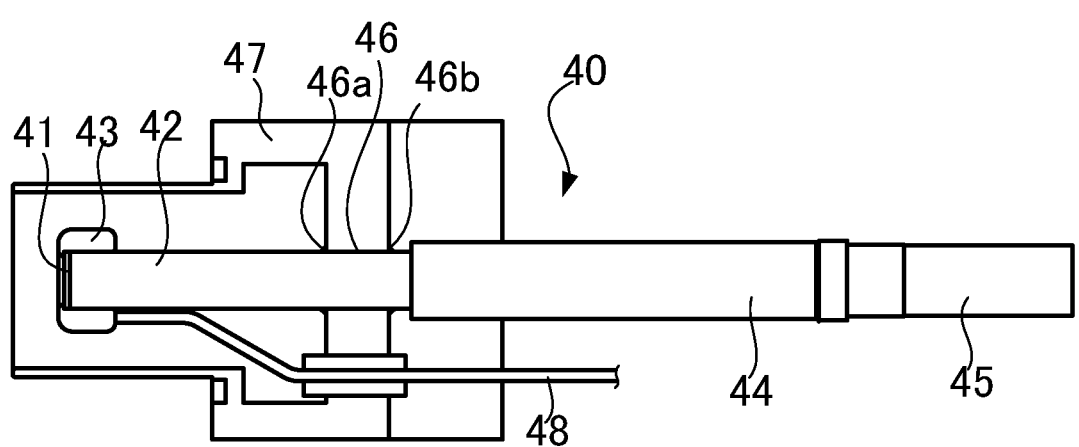
FIG. 3 is a cross-sectional view illustrating a publicly known secondary electron detector.

The secondary electron detector 20 will now be described. FIG. 2 is a cross-sectional view illustrating the secondary electron detector according to an embodiment of the present invention. The secondary electron detector 20 includes a scintillator 21 that generates light upon receipt of secondary electrons from the sample 18, a scintillator cap 22 that is disposed around the scintillator 21 and used as an electrode member to which a high voltage is applied to let the scintillator attract the secondary electrons, a photomultiplier (PMT) 23 that amplifies the light generated by the scintillator, and a socket 24 that accepts the photomultiplier 23. The scintillator 21 is approximately 10 mm in diameter and approximately 1 mm in thickness. The photomultiplier 23 is approximately 14 mm in diameter and 85 mm in overall length.

The scintillator 21 is positioned close to an incidence side 23a of the photomultiplier 23. The scintillator cap 22, which is a substantially cylindrical metal member, is disposed around the incidence side ends of the scintillator 21 and photomultiplier 23. A high voltage (e.g., 10 kV) is applied to the scintillator cap 22 through a cable 29 so that electrons are accelerated toward the scintillator 21. The scintillator cap 22 is approximately 23 mm in outside diameter, approximately 16 mm in inside diameter, and approximately 10 mm in overall length.

It was generally believed that installing the scintillator cap 22 for applying a high voltage to the incidence side 23a of the photomultiplier 23 would affect photoelectrons generated by the photomultiplier 23, thereby affecting the amplification of scintillation light. Hence, a light guide was provided for the photomultiplier and the scintillator cap was mounted on the light guide. However, the inventors of the present invention conducted experiments and verified that the influence on the photoelectrons would not substantially affect an acquired image even when the scintillator cap 22 was disposed on the incidence side 23a of the photomultiplier 23. It should be noted that the shape, dimensions, and other properties of the scintillator cap 22 vary with the employed photomultiplier and other conditions.

The secondary electron detector 20 is mounted in the scanning electron microscope 10 by fitting the photomultiplier 23 into a mounting member 28 and attaching the mounting member 28 to the sample chamber 17. This assures that the scintillator 21 is placed in a vacuum while the socket 24 is placed outside the sample chamber and under atmospheric pressure. Hence, a vacuum seal is formed between the photomultiplier 23 and the mounting member 28. The vacuum seal is formed by filling an adhesive 26 into a gap between the mounting member 28 and the circumference of the photomultiplier 23. The reference numerals 26a and 26b in the figure denote a fill of the adhesive 26. It should be noted that the vacuum seal may be formed with an O-ring.

Further, an insulating member 25 is disposed around the photomultiplier 23 and around its incidence side end. The insulating member 25, which is made, for instance, of opaque fluoro-rubber, includes a cylindrical portion 25a and a wrap-around portion 25b. The cylindrical portion 25a covers the lateral circumference 23b of the photomultiplier 23. The wrap-around portion 25b wraps around the incidence side 23a of the photomultiplier 23. The wrap-around portion 25b protrudes from the peripheral border of the incidence side 23a to the extent that the light of the scintillator 21 is not prevented from entering the photomultiplier 23.

Thus, the insulating member 25 blocks, at the cylindrical portion 25a, the light coming from the lateral circumference 23b of the photomultiplier 23, which is made of transparent glass. This prevents the illumination light of the optical microscope from entering the photomultiplier 23. The insulating member may be made of a material other than fluoro-rubber as far as it has insulation properties and the ability to function in a vacuum. It is preferred that the insulating member 25 be made of an elastic material. If the insulating member 25 is made of an elastic material in a situation where the scintillator cap 22 is to be secured while a machine screw screwed into the lateral side of the scintillator cap 22 abuts against the photomultiplier 23, the leading end of the machine screw strikes the insulating member 25 and receives a repulsive force. This ensures that the scintillator cap 22 is firmly secured to the photomultiplier 23.

Furthermore, the insulating member 25 of the insulating member 25 comes into contact with the scintillator cap 22 and the incidence side 23a of the photomultiplier 23 to provide insulation between them. In the present embodiment, this prevents electrical discharge between the insulating member 25 and the scintillator cap 22. Consequently, the generation of noise is suppressed so that an excellent enlarged image can be obtained from the scanning electron microscope.

Moreover, in the secondary electron detector 20, a gap is formed between the scintillator 21 and the incidence side 23a of the photomultiplier 23 due to the thickness of the wrap-around portion 25b of the insulating member 25. The secondary electron detector 20 includes a band filter 27 that is disposed in the gap. The band filter 27 is an optical filter that blocks light within the wavelength region of the illumination light of the optical microscope 30. In the present embodiment, the band filter 27 prevents the illumination light of the optical microscope from entering the incidence plane of the photomultiplier 23. Consequently, the band filter 27 and the insulating member 25 make it possible to use the optical microscope 30 for the purpose of conducting simultaneous observations.

As described above, the scanning electron microscope according to the present embodiment is configured so that the secondary electron detector does not include a light guide. Therefore, scintillator light deterioration caused by the light guide can be avoided. In this instance, the secondary electron detector is properly vacuum-sealed in the photomultiplier and disposed in the sample chamber of the scanning electron microscope.

Further, as an insulator is provided for the photomultiplier of the secondary electron detector, it is possible to avoid an electric discharge between the photomultiplier and the scintillator cap to which a high voltage is applied. This makes it possible not only to obtain an excellent image but also to let the insulator prevent the entry of unnecessary light from a lateral side of the photomultiplier.

Furthermore, the band filter is disposed between the scintillator and the photomultiplier to prevent the illumination light of the optical microscope from entering the photomultiplier. The insulator, which prevents the entry of light from the lateral side of the photomultiplier, cooperates with the band filter to ensure that an excellent SEM image can be obtained under the illumination of the optical microscope. As a result, the same observation region can be simultaneously observed with the optical microscope and with the scanning electron microscope.

What is claimed is:

1. A secondary electron detector comprising:
   a scintillator for absorbing electrons and emits light;
   a photo-multiplier for amplifying the light emitted from the scintillator;
   an electrode member for accelerating the electrons toward the scintillator; and
   an insulating member, the insulating member is brought into contact with the electrode member and the photomultiplier to provide insulation therebetween;
   the scintillator is disposed on the incidence side end of the photomultiplier;
   the electrode member covers the circumference of the scintillator; and
   the insulating member is disposed between the electrode member and the photomultiplier.

2. The secondary electron detector according to claim 1 further comprising:
   a vacuum seal is formed between the photomultiplier and a device mount,
   the secondary electron detector being mounted on the circumferential surface of the device mount.

3. The secondary electron detector according to claim 1 further comprising:
   a pass filter that blocks light in a particular wavelength region to prevent the light from entering the photomultiplier;
   the pass filter is disposed in a space that is formed by the thickness of the insulating member and positioned between the scintillator and the incidence side end of the photomultiplier.

4. The secondary electron detector according to claim 1 further comprising:
   the insulating member is made of an opaque material for blocking the entry of light and disposed to cover the circumference of the photomultiplier.

5. A charged particle beam apparatus comprising:
   electron beam irradiation means for irradiating a sample with an electron beam;
   a scintillator that absorbs electrons and emits light;
   a photo-multiplier that amplifies the light emitted from the scintillator;
   an electrode member that accelerates the electrons toward the scintillator; and
   an insulating member, the insulating member is brought into contact with the electrode member and the photomultiplier to provide insulation therebetween;
   the scintillator is disposed on the incidence side end of the photomultiplier;
   the electrode member covers the circumference of the scintillator; and
   the insulating member is disposed between the electrode member and the photomultiplier.

6. The secondary electron detector according to claim 5 further comprising:
   a vacuum seal is formed between the photomultiplier and a device mount,
   the secondary electron detector being mounted on the circumferential surface of the device mount.

7. The secondary electron detector according to claim 5 further comprising:
   a pass filter that blocks light in a particular wavelength region to prevent the light from entering the photomultiplier;
   the pass filter is disposed in a space that is formed by the thickness of the insulating member and positioned between the scintillator and the incidence side end of the photomultiplier.

8. The secondary electron detector according to claim 5 further comprising:
   the insulating member is made of an opaque material for blocking the entry of light and disposed to cover the circumference of the photomultiplier.

9. The secondary electron detector according to claim 5 further comprising:
   an optical microscope; and
   a sample illuminating device;
   the sample is observed by using the electron beam and the optical microscope.

10. The secondary electron detector according to claim 5 further comprising:
    the secondary electron detector is vacuum sealed to a lateral side of the photomultiplier.

* * * * *